United States Patent
Sakamoto et al.

(10) Patent No.: US 6,732,344 B2
(45) Date of Patent: May 4, 2004

(54) SEMICONDUCTOR INTEGRATED CIRCUIT DEVICE AND STANDARD CELL PLACEMENT DESIGN METHOD

(75) Inventors: Shinsuke Sakamoto, Yokohama (JP); Akira Yamaguchi, Kitaadachi-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/282,144

(22) Filed: Oct. 29, 2002

(65) Prior Publication Data

US 2003/0080365 A1 May 1, 2003

(30) Foreign Application Priority Data

Oct. 29, 2001 (JP) .......................................... 2001-331294

(51) Int. Cl.[7] ............................................. G06F 17/50
(52) U.S. Cl. ................................. 716/10; 716/8; 716/9; 716/11
(58) Field of Search ................................. 716/8–11, 19; 257/202, 204–207, 565; 326/38–42

(56) References Cited

U.S. PATENT DOCUMENTS

| | | | | | |
|---|---|---|---|---|---|
| 4,161,662 A | * | 7/1979 | Malcolm et al. | ............... | 326/40 |
| 4,661,815 A | * | 4/1987 | Takayama et al. | ............. | 326/41 |
| 4,928,160 A | * | 5/1990 | Crafts | .......................... | 257/206 |
| 5,021,856 A | * | 6/1991 | Wheaton | ..................... | 257/565 |
| 5,369,596 A | * | 11/1994 | Tokumaru | ..................... | 716/19 |
| 5,936,868 A | * | 8/1999 | Hall | .............................. | 716/4 |
| 6,410,972 B1 | * | 6/2002 | Sei et al. | ..................... | 257/499 |
| 6,525,350 B1 | * | 2/2003 | Kinoshita et al. | ........... | 257/202 |

FOREIGN PATENT DOCUMENTS

| | | |
|---|---|---|
| JP | 11-214662 | 8/1999 |
| JP | 2000-269346 | 9/2000 |

OTHER PUBLICATIONS

Kasem, M.; "A new generation of interconnect technology for high performance electronics", Electronics Manufacturing Technology Symposium, 1999. Twenty–Fourth IEEE/CPMT, Oct. 18–19, 1999,Page(s).: 440–447.*

* cited by examiner

Primary Examiner—Vuthe Siek
Assistant Examiner—Naum Levin
(74) Attorney, Agent, or Firm—Oblon, Spivak, McClelland, Maier & Neustadt, P.C.

(57) ABSTRACT

First standard cells with no contact pattern and second standard cells having first contact patterns are placed on an area where a cell array is to be formed. Second contact patterns are additionally placed between the first standard cells. The second contact patterns are placed in an area that lacks a power supply capability.

13 Claims, 4 Drawing Sheets

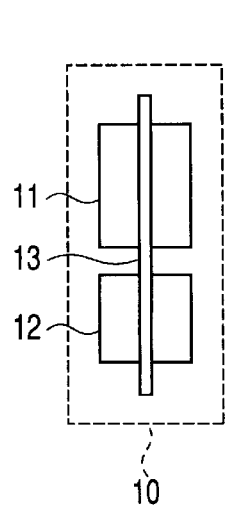
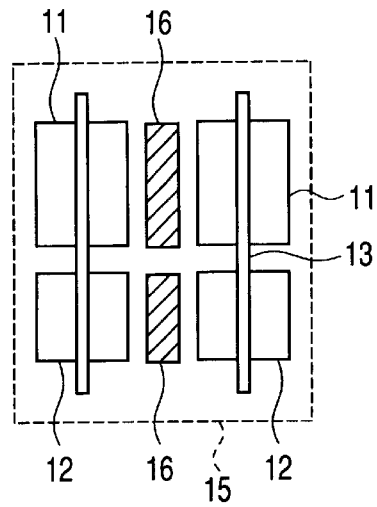
FIG. 3A  FIG. 3B
FIG. 4A
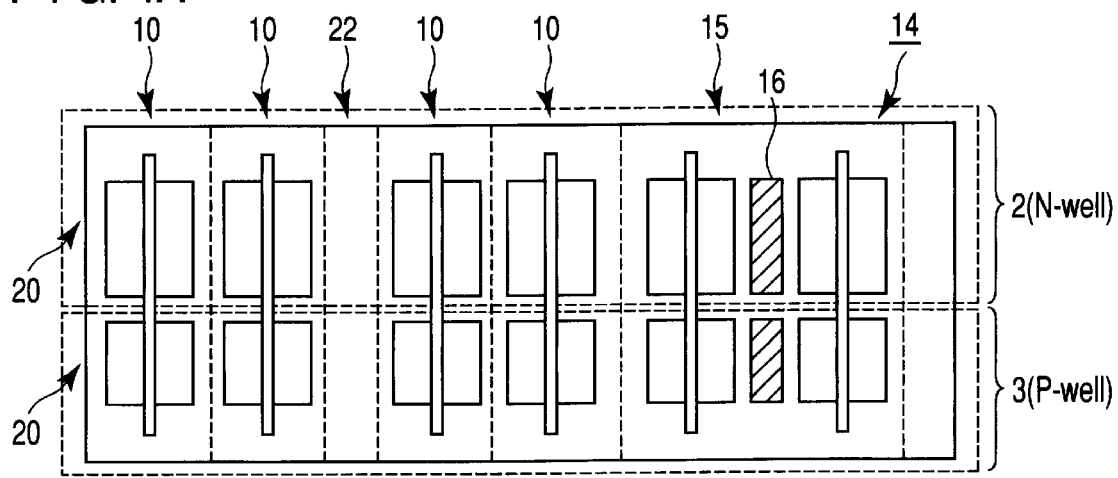
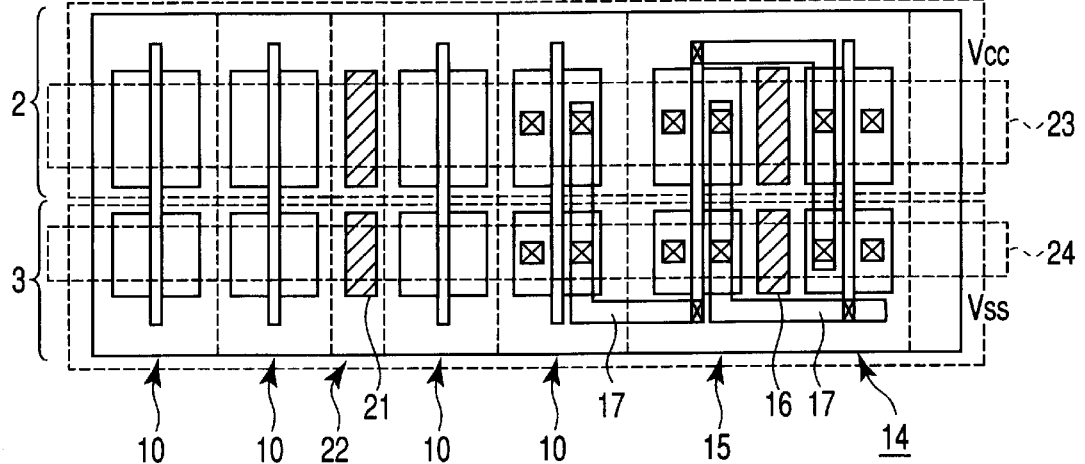
FIG. 4B

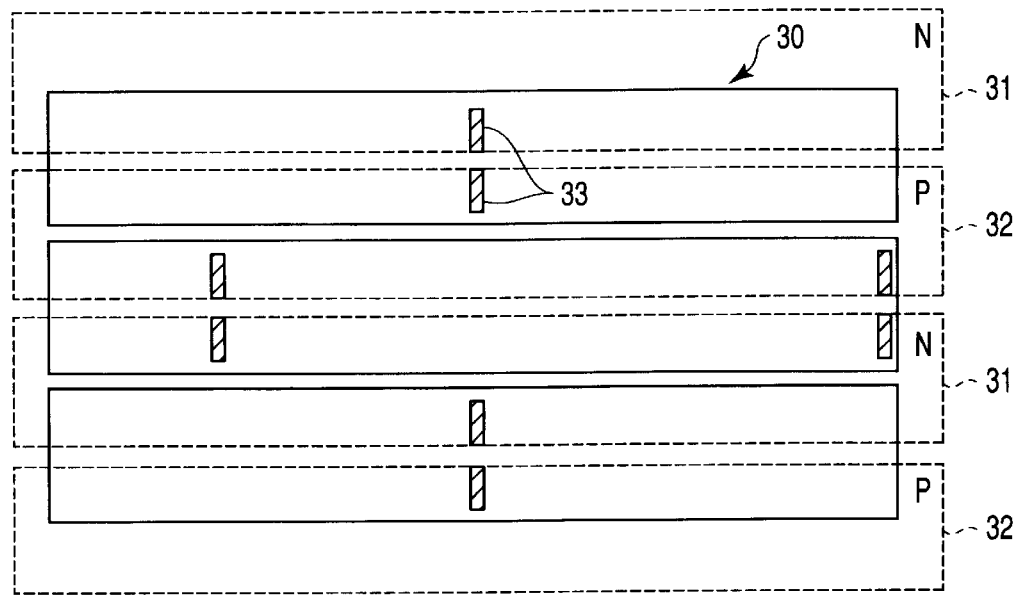
F I G. 6A
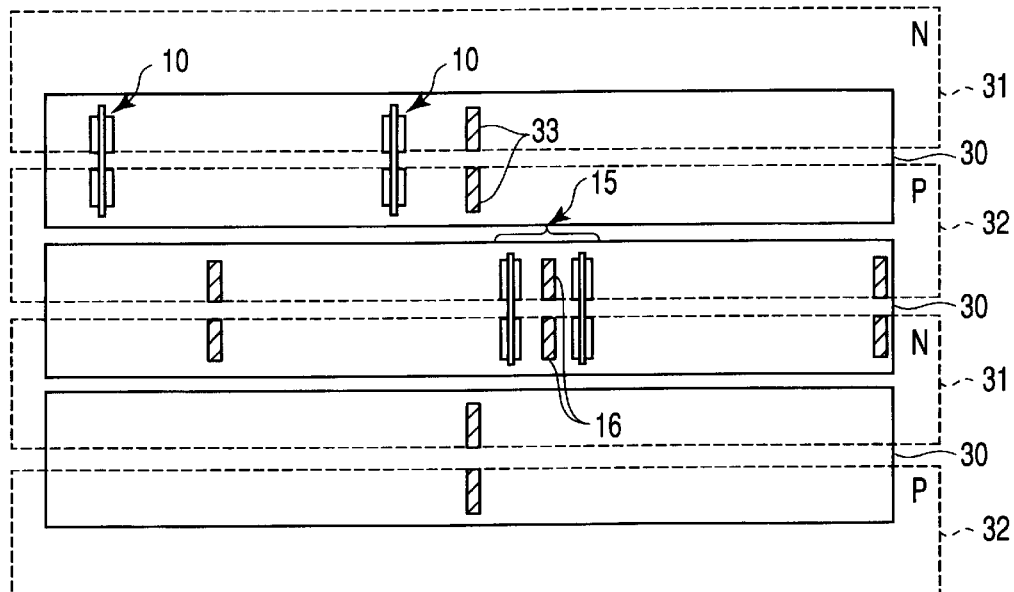
F I G. 6B

SEMICONDUCTOR INTEGRATED CIRCUIT DEVICE AND STANDARD CELL PLACEMENT DESIGN METHOD

CROSS-REFERENCE TO RELATED APPLICATIONS

This application is based upon and claims the benefit of priority from the prior Japanese Patent Application No. 2001-331294, filed Oct. 29, 2001, the entire contents of which are incorporated herein by reference.

BACKGROUND OF THE INVENTION

1. Field of the Invention

The present invention relates to a semiconductor integrated circuit device and a standard cell placement design method and more specifically to the placement of substrate contacts of a standard cell array.

2. Description of the Related Art

In designing standard cell-based LSIs, standard cells, which have previously been standard-designed, are placed through the use of CAD (computer aided design) or EDA (electronic design automation) tools. By suitably forming interconnect lines on the cell array to combine standard cells, any desired circuit can be constructed.

FIGS. 1A and 1B are plan views of conventional standard cell placement patterns.

A standard cell 50a shown in FIG. 1A has a pattern 51 of active regions of a PMOS transistor, a pattern 52 of active regions of an NMOS transistor, a pattern 53 of a gate interconnection placed in common to the paired transistors (CMOS transistor pair), and patterns 54 of a pair of substrate contacts placed on the opposite sides of the gate interconnection pattern 53. The active region pattern 51 of the PMOS transistor is formed on an N well region not shown. The active region pattern 52 of the NMOS transistor is formed on a P well region not shown. The paired substrate contact patterns 54 are placed to correspond to the N-well region and the P-well region, respectively.

A standard cell 50b shown in FIG. 1B has a pattern 51 of active regions of a PMOS transistor, a pattern 52 of active regions of an NMOS transistor, a pattern 53 of a gate interconnection placed in common to the paired transistors (CMOS transistor pair), and patterns 54 of a pair of substrate contacts each placed on one side of a corresponding one of the transistors. The active region pattern 51 of the PMOS transistor is formed on an N-well region not shown. The active region pattern 52 of the NMOS transistor is formed on a P-well region not shown. The paired substrate contact patterns 54 are placed to correspond to the N-well region and the P-well region, respectively.

FIG. 2 is a plan view of a portion of a cell array in which standard cells shown in FIG. 1A are placed.

That is, any desired circuit can be constructed by placing a number of standard cells 50a as shown in FIG. 1A to form an array and forming desired signal interconnections and power supply system on the array. For example, the use of a single standard cell 50a allows a CMOS inverter circuit to be formed. The use of two standard cells 50a can form a CMOS flip-flop circuit.

The conventional standard cell-based LSIs thus designed require a pair of substrate contacts 54 for each of standard cells that form a cell array. For this reason, the entire integrated circuit chip will have more substrate contacts than necessary.

The extra substrate contacts reduces the packing density of cells on a chip per unit area. In other words, the size of the standard cell array increases, resulting in an increase in chip size. In addition, since no interconnection can be placed on each substrate contact, the region where interconnections are to be placed on the chip will be reduced.

As described above, the conventional standard cell-based LSIs have problems that the size of the standard cell array increases, the chip size increases, and the interconnection region decreases.

BRIEF SUMMARY OF THE INVENTION

According to an aspect of the present invention, there is provided a semiconductor integrated circuit device comprising: a plurality of first standard cells that form a cell array, each of the first standard cells having no contact pattern; a second standard cell that forms the cell array in combination with the first standard cells, the second standard cell having first contact patterns; and second contact patterns placed within the cell array, the number of the second contact patterns being smaller than that of the first standard cells.

According to another aspect of the present invention, there is provided a standard cell placement design method comprising: providing a spare area where additional substrate contacts are to be placed in a cell array forming an area where a cell array is to be formed; placing first and second standard cells in that area in the cell array forming area where the additional substrate contacts are not to be placed, the first standard cells having no contact pattern and the second standard cells having first contact patterns; placing the second contact patterns in the spare area; and placing power supply interconnection patterns over the cell array forming area, the power supply interconnection patterns being connected to the first and second contact patterns.

BRIEF DESCRIPTION OF THE SEVERAL VIEWS OF DRAWING

FIGS. 3A and 3B are plan views of patterns of two types of standard cells placed on a standard cell-based LSI chip in accordance with a first embodiment of the present invention;

FIGS. 4A and 4B are plan views illustrating the process of forming a cell array by placing the two types of standard cells shown in FIGS. 3A and 3B through the use of EDA tools;

Figure 1A:
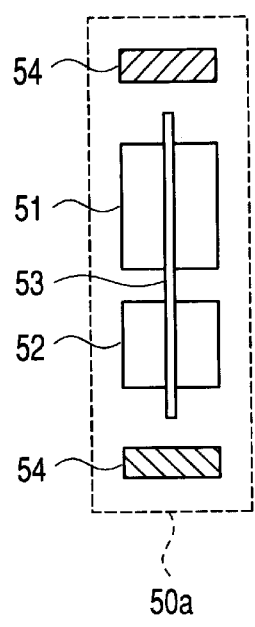
FIGS. 1A and 1B are plan views of conventional standard cell placement patterns.
Figure 1B:
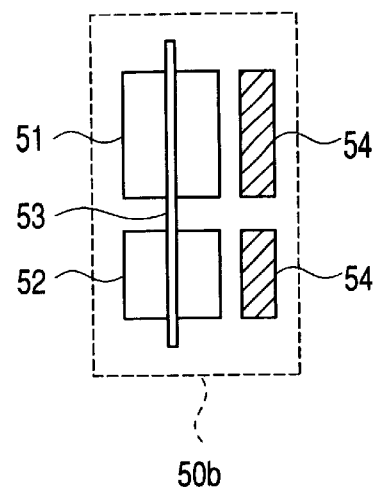
Figure 2:
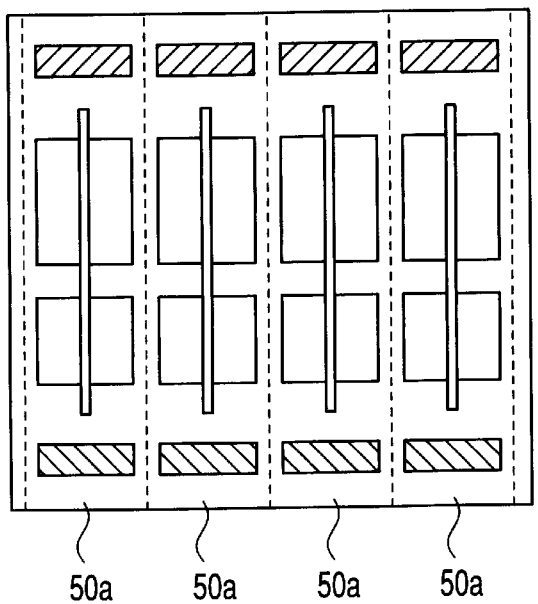
FIG. 2 is a plan view of a portion of a cell array in which standard cells shown in FIG. 1A are placed.
Figure 5A:
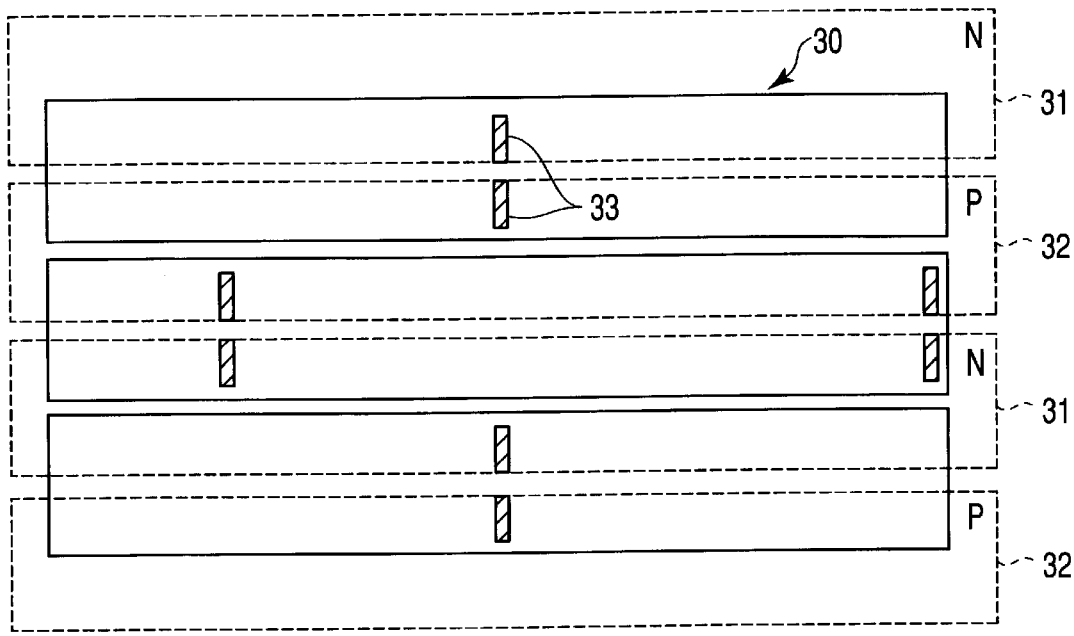
Figure 5B:
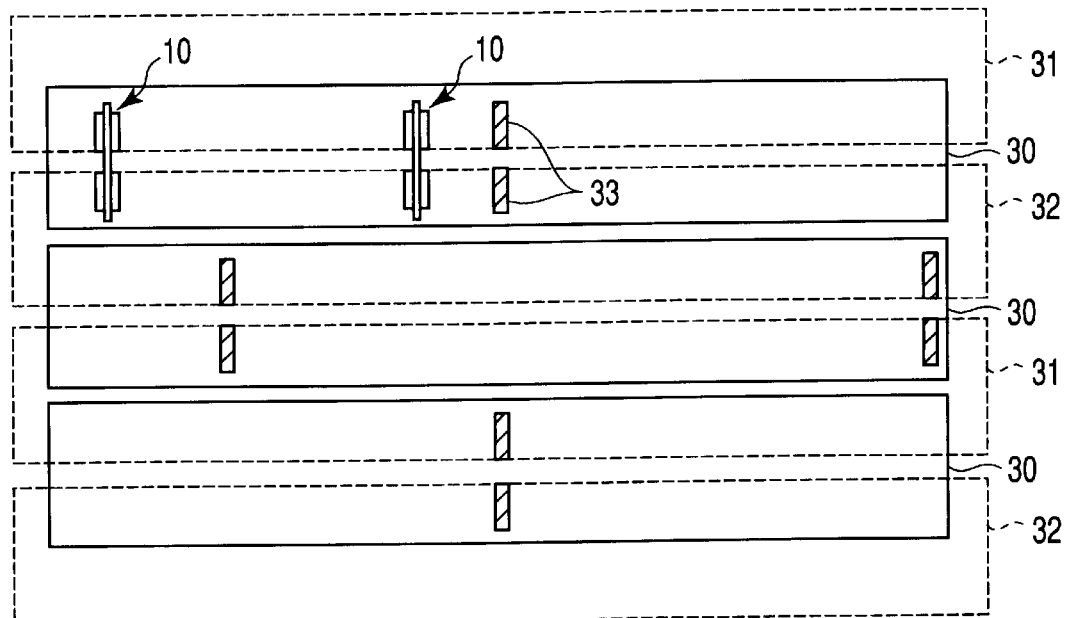

FIGS. 5A and 5B are plan views illustrating the process of forming a cell array by placing the standard cells shown in FIG. 3B through the use of EDA tools in accordance with a second embodiment of the present invention; and FIGS. 6A and 6B are plan views illustrating the process of forming a cell array by placing the two types of standard cells shown in FIGS. 3A and 3B through the use of EDA tools in accordance with a third embodiment of the present invention.

DETAILED DESCRIPTION OF THE INVENTION

The preferred embodiments of the present invention will be described hereinafter with reference to the accompanying drawings.

[LSI and Standard Cell Placement Design Method of First Embodiment]

FIGS. 3A and 3B show, in plan view, patterns of two types of standard cells placed on a standard cell-based LSI chip in accordance with a first embodiment of the present invention.

A first standard cell 10 shown in FIG. 3A has a pattern 11 of active regions of a PMOS transistor, a pattern 12 of active regions of an NMOS transistor, and a pattern 13 of a gate interconnection connected in common to the two transistors (CMOS transistor pair). This standard cell 10 has no substrate contact pattern. That is, for the first standard cell 10, the placement of the substrate contact patterns is not prescribed. The active region pattern 11 of the PMOS transistor is formed on an N well region, not shown in the LSI chip. The active region pattern 12 of the NMOS transistor is formed on a P well region, not shown.

A second standard cell 15 shown in FIG. 3B has two standard cells juxtaposed, each of which is identical to the first standard cell 10 shown in FIG. 3A. Paired substrate contact patterns 16 are placed between the two standard cells. The paired substrate contact patterns 16 are placed to correspond to N and P well regions (not shown), respectively.

FIGS. 4A and 4B illustrate, in plan view, the process of forming a cell array by placing the two types of standard cells shown in FIGS. 3A and 3B through the use of EDA tools.

As shown in FIG. 4A, the first and second standard cells 10 and 15 are placed intermixed with each other in an area 14 of a standard cell-based LSI where a cell array is to be formed. In this case, to compensate for the lack of power supply capability, one or more spare areas 22 for additional substrate contact patterns 21 are provided as shown in FIG. 4B. If unoccupied areas are produced after the placement of cells, they may be used as the spare areas.

The rules for placing the additional substrate contacts 21 include distributing the substrate contact patterns 16 and 21 approximately uniformly in each cell array 20 and placing the substrate contacts 21 in positions where current density is distributed approximately uniformly in the well regions. The placement of the substrate contacts 21 may be determined according to these rules. The additional placement of the substrate contact patterns 21 according to the rules can be implemented by adding a new function that conforms to the rules to the EDA tools. The number of the patterns 21 placed in this manner will be smaller than that of the first standard cells 10.

Next, as shown in FIG. 4B, paired substrate contact patterns 21 are placed in the spare region 22. Each of these patterns is placed to correspond to a respective one of the N and P well regions 2 and 3 in contact with it. After that, desired interconnect patterns 17 are placed to connect the first standard cell 10 and the second standard cell 15, thus forming a desired circuit. A linear pattern 23 of a power supply interconnect (Vcc interconnect) is then placed over the N well region 2 in which the standard cells are formed. This pattern 23 is connected to the substrate contacts 16 and 21 for the N well region 2. Likewise, a linear pattern 24 of a ground interconnect (Vss interconnect) is placed over the P well region 3 in which the standard cells are formed. This pattern 24 is connected to the substrate contacts 16 and 21 for the P well region 3.

With the placement described above, therefore, the use of a single first standard cell 10 allows, for example, a CMOS inverter circuit to be formed. The use of a single second standard cell 15 allows, for example, the formation of a CMOS flip-flop circuit.

Note that the first standard cell 10 has about 30% less pattern area than the conventional standard cells 50a and 50b for which the placement of substrate contact patterns has been prescribed.

Since the first standard cell 10 has less transistors than the second standard cell 10, the effect of reducing the pattern area is greater in the former than in the latter. That is, if substrate contacts are formed in the first standard cell 10 which does not have many transistors and hence inherently occupies a small area, an increase in pattern area will become large.

In contrast, if the second standard cell 15 has more transistors than the first standard cell 10, an increase in pattern area resulting from placing substrate contact patterns is small. Therefore, the substrate contact patterns are placed in the second standard cell 15.

In the standard cell-based LSI according to the first embodiment, the first standard cells 10 having no substrate contact patterns placed and the second standard cells 15 having the substrate contact patterns 16 placed are intermixed and the additional substrate contact patterns 21 are placed in desired positions near the first standard cells 10.

That is, the substrate contact patterns 16 and 21 are placed only in parts of the standard cells (i.e., the second standard cells) and desired positions (i.e., the spare areas where additional substrate contacts are to be placed).

Therefore, the substrate contact patterns 16 and 21 can be suitably placed overall. For this reason, the presence of more substrate contact areas than necessary is avoided, allowing the packing density of cells on chip per unit area to be increased. In other words, it becomes possible to prevent an increase in the size of the standard cell array, an increase in the chip size and a reduction in the interconnect area.

[LSI and Standard Cell Placement Design Method of a Second Embodiment]

FIGS. 5A and 5B illustrate, in plan view, the process of forming a cell array by placing the standard cell shown in FIG. 3A through the use of EDA tools in accordance with a second embodiment of the present invention.

First, as shown in FIG. 5A, in cell rows 30 in an area where a cell array is to be formed, substrate contact patterns 33 (or cells of substrate contact patterns only) are placed in advance on N and P well regions 31 and 32 in accordance with fixed rules. The aforementioned two rules can be applied to the substrate contact placement rules. Alternatively, the substrate contacts may be placed to correspond to areas where circuits, such as flip-flop circuits and latch circuits, that are larger in size than inverter circuits are formed.

After that, as shown in FIG. 5B, such standard cells 10 that do not have substrate contact patterns as shown in FIG. 3A are placed on the N and P well regions 31 and 32. Subsequently, desired interconnection patterns not shown are placed, thereby forming a desired circuit.

Such Vcc interconnection patterns 23 and Vss interconnection patterns 24 as shown in FIG. 4B are each placed in a straight line. The Vcc interconnection patterns 23 are connected, over the N well regions 31, with the substrate contacts corresponding to these N well regions. The Vss interconnection patterns 24 are connected, over the P well regions 32, with the substrate contacts corresponding to these P well regions.

In FIGS. 5A and 5B, like reference numerals are used to denote corresponding parts to those in FIGS. 3A and 4B.

In the standard cell-based LSI according to the second embodiment of the present invention, the substrate contact patterns 33 are placed on the N and P well regions 31 and 32 in an area where a cell array is to be formed in accordance with fixed rules and the first standard cells 10 having no substrate contact pattern are placed in the vicinity of those patterns. That is, the substrate contact patterns 33 are placed only in the vicinity of the first standard cells 10 and in desired positions. For this reason, a suitable number of substrate contact patterns will be placed within a chip, leading to non-existence of redundant substrate contact areas. Therefore, it becomes possible to prevent the size of the standard cell array from increasing, the chip size from increasing, and the interconnect area from reducing.

[LSI and Standard Cell Placement Design Method of Third Embodiment]

FIGS. 6A and 6B illustrate, in plan view, the process of forming a cell array by placing the two types of standard cells shown in FIGS. 3A and 3B through the use of EDA tools in accordance with a third embodiment of the present invention. In FIGS. 6A and 6B, like reference numerals are used to denote corresponding parts to those in FIGS. 3A, 3B and 4B.

First, as shown in FIG. 6A, in cell rows 30 in an area where a cell array is to be formed, substrate contact patterns 33 (or cells of substrate contact patterns only) are placed in advance on N and P well regions 31 and 32 in accordance with fixed rules. The substrate contact placement rules may be the same as with the second embodiment.

After that, as shown in FIG. 6B, such first standard cells 10 that do not have substrate contact patterns as shown in FIG. 3A and such second standard cells 15 that have substrate contact patterns as shown in FIG. 3B are placed intermixed on the N and P well regions 31 and 32. Subsequently, desired interconnection patterns, not shown, are placed, thereby forming a desired circuit.

Such Vcc interconnection patterns 23 and Vss interconnection patterns 24 as shown in FIG. 4B are each placed in a straight line. The Vcc interconnection patterns 23 are connected, over the N well regions 31, with the substrate contacts corresponding to these N well regions. The Vss interconnection patterns 24 are connected, over the P well regions 32, with the substrate contacts corresponding to these P well regions.

In conventional standard cells having substrate contact patterns, supposing that the average cell width is nine grids and the size of a substrate contact pattern is two grids, it is possible to place 11 cells (99 grid width), on average, within an area of 100 grids by way of example. In the 100 grids, however, 22 grids (=2×11) will be occupied by redundant substrate contact patterns.

In contrast, according to the LSI and standard cell placement design method of the present invention, considering that, for example, one substrate contact pattern is placed every 100 grids as conditions for additional placement of substrate contact patterns, most of the area of 100 grids can be allocated for cells and interconnections. Therefore, if the substrate contact patterns can be placed over the entire cell array under the above conditions, a reduction in area of about 22% (=22/100) will be achieved.

In the standard cell placement design methods of the second and third embodiments, the substrate contact patterns 33 (or cells of substrate contact patterns only) are placed in advance. As an alternative, the substrate contact patterns 33 (or cells of substrate contact patterns only) may be placed suitably after the placement of desired standard cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A standard cell placement design method comprising:
providing a spare area where additional substrate contacts are to be placed in a cell array forming area where a cell array is to be formed;

placing first and second standard cells in that area in the cell array forming area where the additional substrate contacts are not to be placed, the first standard cells having no contact pattern which is connected to a well region and the second standard cells having first contact patterns which are connected to the well region;

placing second contact patterns as the substrate contacts in the spare area, the second contact patterns being connected to the well region; and placing power supply interconnection patterns over the cell array forming area, the power supply interconnection patterns being connected to the first and second contact patterns.

2. The method according to claim 1, wherein the spare area is placed in an area that lacks a power supply capability.

3. The method according to claim 1, wherein the second contact patterns are placed distributed uniformly in the cell array.

4. The method according to claim 1, wherein the second contact patterns are placed in positions in the cell array where current density is distributed uniformly.

5. A standard cell placement design method comprising:
placing first contact patterns on a cell array forming area where a cell array is to be formed in accordance with fixed rules, the first contact patterns being connected to a well region;

placing a plurality of first standard cells having no contact pattern which is connected to the well region on the cell array forming area; and placing power supply interconnection patterns over the first standard cells, the power supply interconnection patterns being connected to the first contact patterns.

6. The method according to claim 5, further comprising second standard cells each with second contact patterns on the cell array forming area.

7. The method according to claim 5, wherein the first contact patterns are placed in an area that lacks a power supply capability.

8. The method according to claim 5, wherein the first contact patterns are placed distributed uniformly in the cell array.

9. The method according to claim 5, wherein the first contact patterns are placed in positions in the cell array where current density is distributed uniformly.

10. A standard cell placement design method comprising:
placing first contact pattern areas on a cell array forming area where a cell array is to be formed in accordance with fixed rules, the first contact patterns being connected to a well region;

placing first and second standard cells on the cell array forming area, the first standard cells having no contact pattern which is connected to the well region and the second standard cells having second contact patterns which are connected to the well region; and placing power supply interconnection patterns over the first and second standard cells, the power supply interconnection patterns being connected to the first and second contact patterns.

11. The method according to claim 10, wherein the first contact patterns are placed in an area that lacks a power supply capability.

12. The method according to claim 10, wherein the first contact patterns are placed distributed uniformly in the cell array.

13. The method according to claim 10, wherein the first contact patterns are placed in positions in the cell array where current density is distributed uniformly.

* * * * *